United States Patent
Chang et al.

(10) Patent No.: US 9,887,088 B1
(45) Date of Patent: Feb. 6, 2018

(54) METHOD FOR FABRICATING SEMICONDUCTOR DEVICE

(71) Applicants: UNITED MICROELECTRONICS CORP., Hsin-Chu (TW); Fujian Jinhua Integrated Circuit Co., Ltd., Quanzhou, Fujian province (CN)

(72) Inventors: Feng-Yi Chang, Tainan (TW); Shih-Fang Tzou, Tainan (TW); Fu-Che Lee, Taichung (TW); Ming-Feng Kuo, Tainan (TW); Li-Chiang Chen, Tainan (TW)

(73) Assignees: UNITED MICROELECTRONICS CORP., Hsin-Chu (TW); Fujian Jinhua Integrated Circuit Co., Ltd., Quanzhou, Fujian province (CN)

( * ) Notice: Subject to any disclaimer, the term of this patent is extended or adjusted under 35 U.S.C. 154(b) by 0 days.

(21) Appl. No.: 15/452,743

(22) Filed: Mar. 8, 2017

(30) Foreign Application Priority Data

Dec. 30, 2016 (CN) .......................... 2016 1 1258720

(51) Int. Cl.
*H01L 21/28* (2006.01)
*H01L 21/3213* (2006.01)

(52) U.S. Cl.
CPC .. *H01L 21/28088* (2013.01); *H01L 21/32135* (2013.01)

(58) Field of Classification Search
CPC ........... H01L 29/66621; H01L 29/4236; H01L 21/32135
USPC .......................... 257/296, 330; 438/592, 589
See application file for complete search history.

(56) References Cited

U.S. PATENT DOCUMENTS

| 8,153,489 | B2 | 4/2012 | Song |
| 8,785,998 | B2 | 7/2014 | Chung et al. |
| 2005/0104107 | A1* | 5/2005 | Fazan ................. H01L 21/7687 257/296 |
| 2012/0086060 | A1* | 4/2012 | Taniguchi ......... H01L 21/76232 257/296 |
| 2013/0302958 | A1* | 11/2013 | Hossain ............ H01L 29/66348 438/270 |
| 2015/0221742 | A1* | 8/2015 | Yi ........................ H01L 29/4236 257/295 |

* cited by examiner

*Primary Examiner* — Marcos D Pizarro Crespo
*Assistant Examiner* — Antonio Crite
(74) *Attorney, Agent, or Firm* — Winston Hsu

(57) ABSTRACT

A method for fabricating semiconductor device includes the steps of: providing a substrate having a memory region defined thereon; forming a trench in the substrate; forming a barrier layer in the trench; forming a conductive layer on the barrier layer; performing a first etching process to remove part of the conductive layer; and performing a second etching process to remove part of the barrier layer. Preferably, the second etching process comprises a non-plasma etching process.

14 Claims, 4 Drawing Sheets ered by the patterned mask to form at least a trench 28 in the substrate 16 on the memory region 20.

METHOD FOR FABRICATING SEMICONDUCTOR DEVICE

BACKGROUND OF THE INVENTION

1. Field of the Invention

The invention relates to a method for fabricating semiconductor device, and more particularly to a method for fabricating a dynamic random access memory (DRAM) device.

2. Description of the Prior Art

As electronic products develop toward the direction of miniaturization, the design of dynamic random access memory (DRAM) units also moves toward the direction of higher integration and higher density. Since the nature of a DRAM unit with buried gate structures has the advantage of possessing longer carrier channel length within a semiconductor substrate thereby reducing capacitor leakage, it has been gradually used to replace conventional DRAM unit with planar gate structures.

Typically, a DRAM unit with buried gate structure includes a transistor device and a charge storage element to receive electrical signals from bit lines and word lines. Nevertheless, current DRAM units with buried gate structures still pose numerous problems due to limited fabrication capability. Hence, how to effectively improve the performance and reliability of current DRAM device has become an important task in this field.

SUMMARY OF THE INVENTION

A method for fabricating semiconductor device includes the steps of: providing a substrate having a memory region defined thereon; forming a trench in the substrate; forming a barrier layer in the trench; forming a conductive layer on the barrier layer; performing a first etching process to remove part of the conductive layer; and performing a second etching process to remove part of the barrier layer. Preferably, the second etching process comprises a non-plasma etching process.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
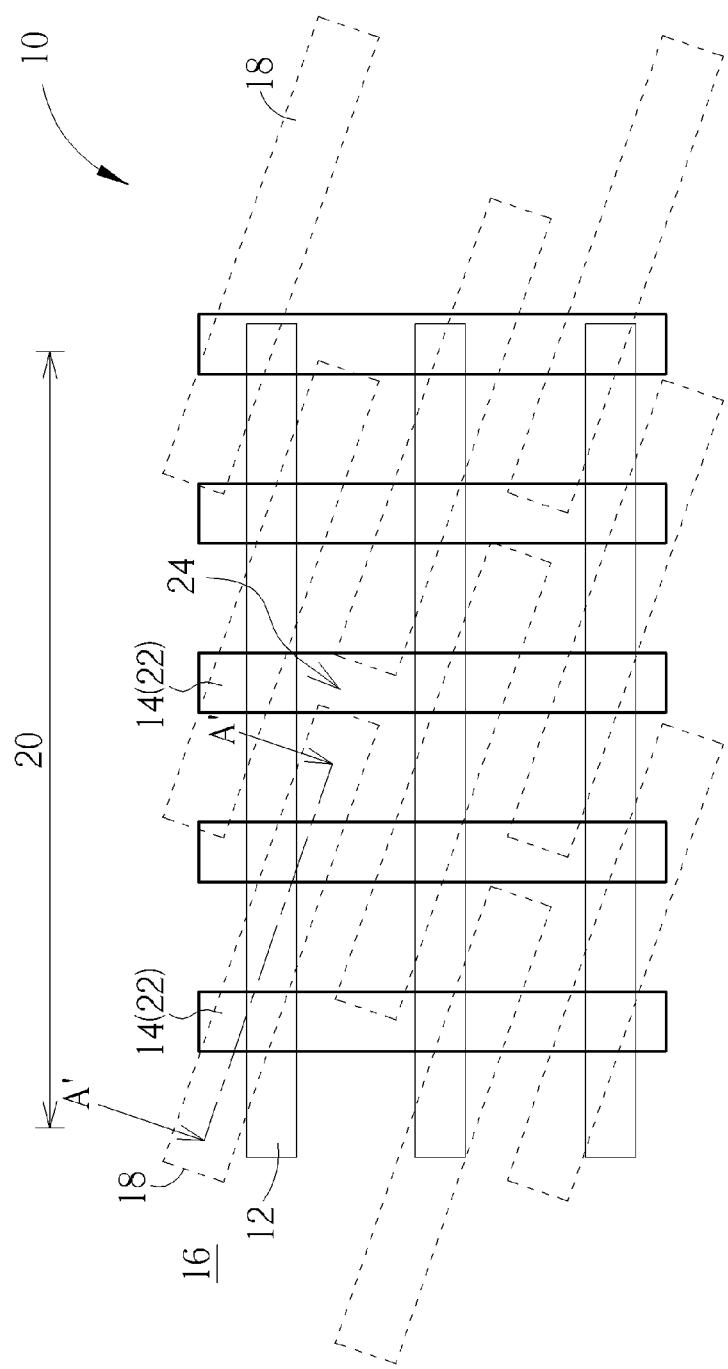
FIGS. 1-6, FIGS. 1-6 illustrate a method for fabricating a DRAM device according to a preferred embodiment of the present invention.

Referring to FIGS. 1-6, FIGS. 1-6 illustrate a method for fabricating a DRAM device according to a preferred embodiment of the present invention, in which FIG. 1 illustrates a top-view diagram and FIGS. 2-6 illustrate cross-sectional views of FIG. 1 along the sectional line AA'. Preferably, the present embodiment pertains to fabricate a memory device, and more particularly a DRAM device 10, in which the DRAM device 10 include at least a transistor device (not shown) and at least a capacitor structure (not shown) that will be serving as a smallest constituent unit within the DRAM array and also used to receive electrical signals from bit lines 12 and word lines 14.

As shown in FIG. 1, the DRAM device 10 includes a substrate 16 such as a semiconductor substrate or wafer made of silicon, a shallow trench isolation (STI) 24 formed in the substrate 16, and a plurality of active areas (AA) 18 defined on the substrate 16. A memory region 20 and a periphery region (not shown) are also defined on the substrate 16, in which multiple word lines 14 and multiple bit lines 12 are preferably formed on the memory region 20 while other active devices (not shown) could be formed on the periphery region. For simplicity purpose, only devices or elements on the memory region 20 are shown in FIG. 1 while elements on the periphery region are omitted.

In this embodiment, the active regions 18 are disposed parallel to each other and extending along a first direction, the word lines 14 or multiple gates 22 are disposed within the substrate 16 and passing through the active regions 18 and STIs 24. Preferably, the gates 22 are disposed extending along a second direction, in which the second direction crosses with the first direction at an angle less than 90 degrees.

The bit lines 12 on the other are disposed on the substrate 16 parallel to each other and extending along a third direction while crossing the active regions 18 and STI 24, in which the third direction is different from the first direction and orthogonal to the second direction. In other words, the first direction, second direction, and third direction are all different from each other while all three directions are also not perpendicular to each other. Preferably, contact plugs such as bit line contacts (BLC) (not shown) are formed in the active regions 18 adjacent to two sides of the word lines 14 to electrically connect to source/drain region (not shown) of each transistor element and storage node contacts (not shown) are formed to electrically connect to a capacitor.

Figure 2:
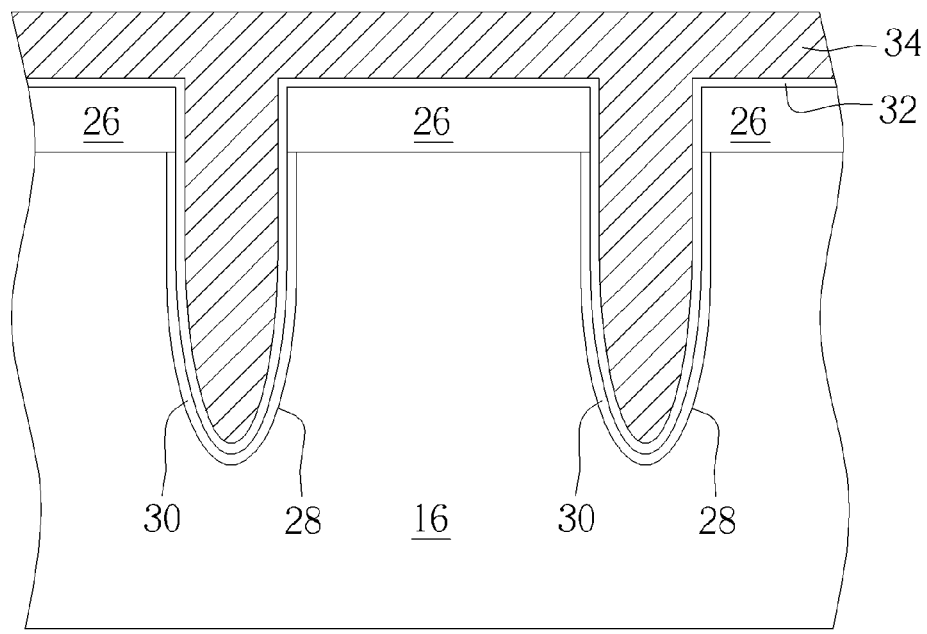

The fabrication of word lines 14 (or also referred to as buried word lines) is explained below. As shown in FIG. 2, a dielectric layer 26 is first formed on the substrate 16, and a photo-etching process for example is conducted by forming a patterned mask on the dielectric layer 26, and then using an etching process to remove part of the dielectric layer 26 and part of the substrate 16 not covered by the patterned mask to form at least a trench 28 in the substrate 16 on the memory region 20.

Next, an in-situ steam generation (ISSG) process is conducted to form a gate dielectric layer 30 made of silicon oxide in the trench 28. Next, a barrier layer 32 is formed on the top surface of the dielectric layer 26, sidewalls of the dielectric layer 26, and the surface of the gate dielectric layer 30, and then a conductive layer 34 is formed on the barrier layer 32, in which the conductive layer 34 is formed not only to fill the trench 28 completely but also over the surface of the dielectric layer 26. In this embodiment, the dielectric layer 26 preferably includes silicon oxide, the barrier layer 32 preferably includes titanium nitride (TiN), and the conductive layer 34 preferably includes tungsten (W), but not limited thereto.

Figure 3:
Figure 3:
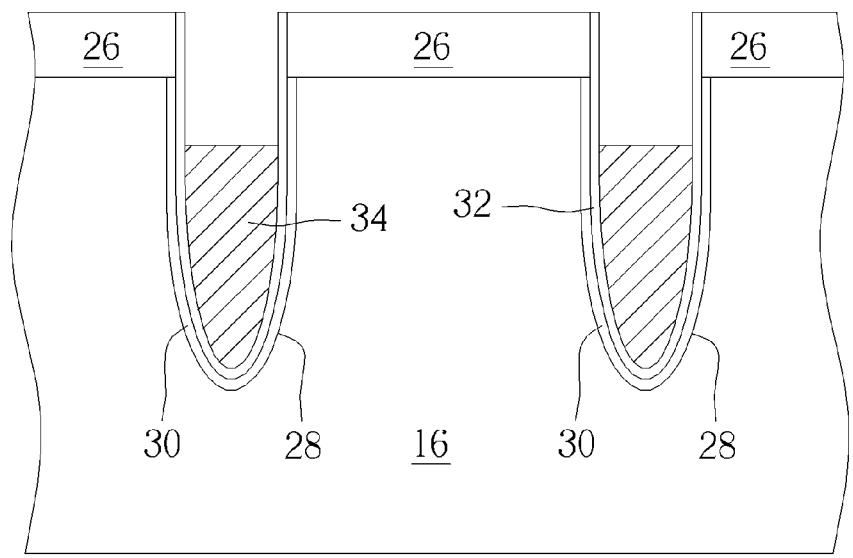

Next, as shown in FIG. 3, a first etching process 48 is conducted to remove part of the conductive layer 34 so that the top surface of the conductive layer 34 is slightly lower than the surface of the substrate 16. In this embodiment, the first etching process 48 preferably includes a dry etching process and an etching gas used in the first etching process 48 could include but not limited to for example $NF_3$, $SF_6$, or combination thereof.

Figure 4:
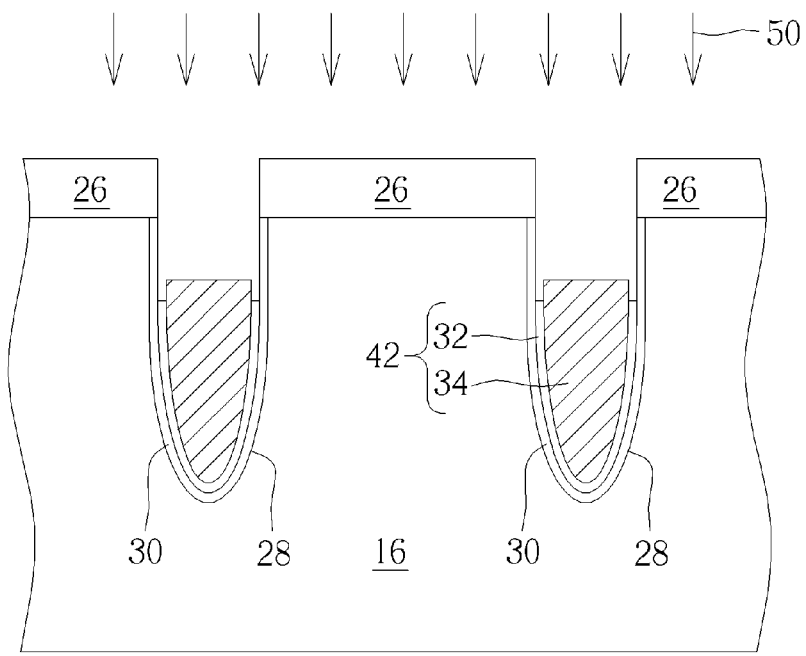

Next, as shown in FIG. 4, a second etching process 50 is conducted to remove part of the barrier layer 32 so that the top surface of the remaining barrier layer 32 to be lower than the surface of the substrate 16 and even slightly lower than the top surface of the conductive layer 34. It should be noted that even though the top surface of the remaining barrier layer 32 is slightly lower than the top surface of the conductive layer 34 in this embodiment, it would also be desirable to adjust the fabrication parameters including but not limited to for example etching time or gas composition and ratio of the second etching process 50 so that the top surfaces of the remaining barrier layer 32 and conductive layer 34 are coplanar, which is also within the scope of the present invention.

Figure 5:
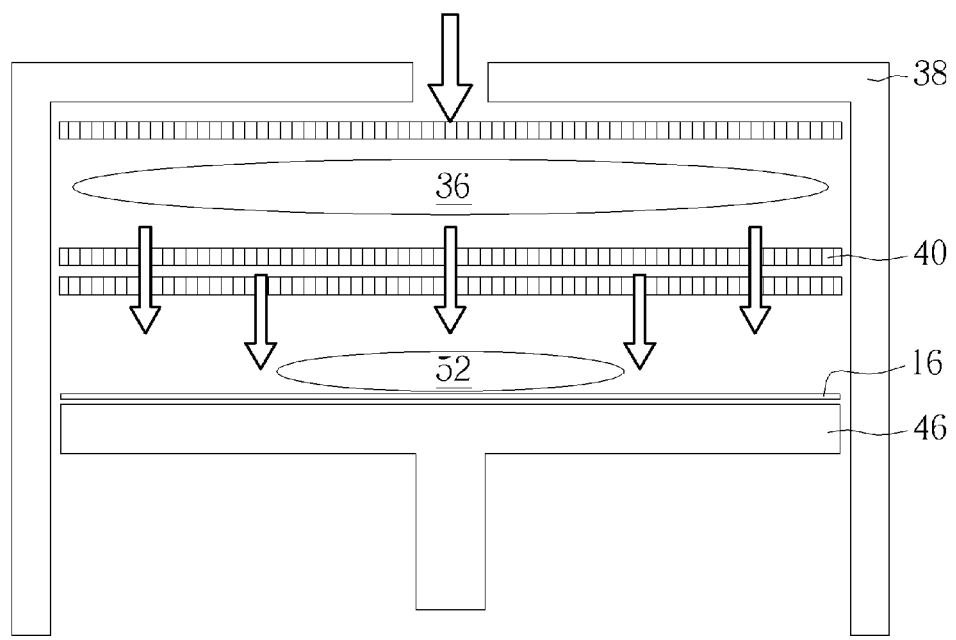

According to a preferred embodiment of the present invention, the second etching process 50 preferably includes a non-plasma etching process, in which the non-plasma etching could be accomplished by multiple means in this embodiment. For example, as shown in FIG. 5, it would be desirable to first place the substrate 16 onto a pedestal 46 inside a reaction chamber 38 and then introducing or injecting a first gas 36 such as an ionized gas into the chamber 38, in which the ionized gas could include ionized gas and radicals that has been dissociated and carrying positive and negative charges at the same time. An example of the first gas 36 in this embodiment is chlorine gas. Next, an ion filter 40 is used to remove positive and negative charges from the first gas 36 to form a second gas 52, such as a gas not carrying any charges. In other words, the charge carrying ionized gas or first gas 36 such as chlorine gas after being filtered by the ion filter 40 is transformed or returned to its atomic state such as chlorine atoms without carrying any charges. Next, the second gas 52 containing chlorine atoms carrying no charges is then used as etching gas source in the second etching process 50 to remove part of the barrier layer 32. It should be noted that since the second etching process 50 of this embodiment uses a gas not carrying any charges as etching medium instead of a gas carrying charges as used in current process, the second etching process 50 or non-plasma etching process could bring out a bombardment free advantage so that none of the adjacent element such as gate dielectric layer 30 is damaged during the etching procedure of barrier layer 32.

According to an embodiment of the present invention, the second etching process 50 of non-plasma etching process could also include a soft etching process, in which the soft etching process could be accomplished by using gas such as chlorine gas ($Cl_2$), helium gas (He), or combination thereof to remove part of the barrier layer 32. In this embodiment, an etching selectivity of the barrier layer 32 to conductive layer 34 is preferably greater than 50%, but not limited thereto.

According to yet another embodiment of the present invention, the second etching process 50 or non-plasma etching process could be accomplished by using a vapor etching process to remove part of the barrier layer 32. In this embodiment, a gas of the vapor etching process is selected from the group consisting of $NH_3$, $H_2O_2$, HCl, $H_2O$, and $H_2SO_4$. a temperature of the vapor etching process is between 25° C. to 60° C. and a pressure of the vapor etching process is less than 100 mTorr and greater than 0 mTorr.

Figure 6:
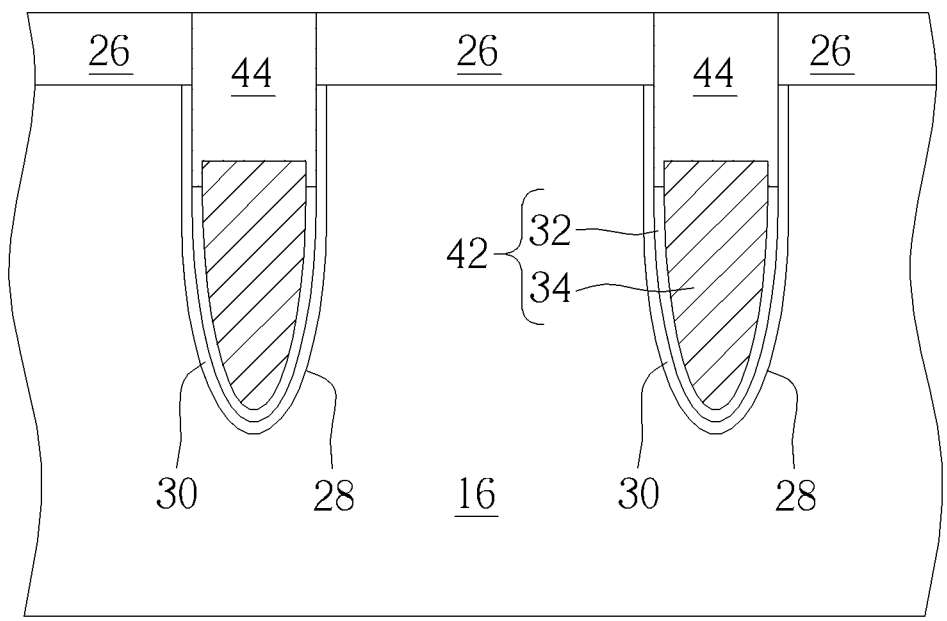

After the first etching process and second etching process from the aforementioned embodiments are conducted, the remaining barrier layer 32 and conductive layer 34 then become gate electrodes 42. Next, as shown in FIG. 6, a hard mask 44 preferably made of material such as silicon nitride is formed on each of the gate electrodes 42, in which the top surfaces of the hard mask 44 and dielectric layer 26 are coplanar. This completes the fabrication of buried word lines according to a preferred embodiment of the present invention.

Next, it would be desirable to conduct an ion implantation process to form a doped region (not shown) adjacent to two sides of the gate electrode 42 in the substrate 16 to serve as a lightly doped drain (LDD) or source/drain region. Next, contact plug fabrication could be conducted to form bit line contacts adjacent to two sides of gate electrode 32 to electrically connect the source/drain region and bit lines formed afterwards as well as storage node contacts to electrically connect to the source/drain region and capacitors fabricated in the later process.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating semiconductor device, comprising:
   providing a substrate having a memory region defined thereon;
   forming a trench in the substrate;
   forming a barrier layer in the trench;
   forming a conductive layer on the barrier layer;
   performing a first etching process to remove part of the conductive layer without removing the barrier layer; and
   performing a second etching process to remove part of the barrier layer, wherein the first etching process and the second etching process are different, the second etching process comprises a non-plasma etching process, and the second etching process comprises:
   injecting an ionized first gas into a chamber;
   using an ion filter to remove charges from the first gas to form a second gas; and
   using the second gas to remove part of the barrier layer.

2. The method of claim 1, wherein the first gas comprises chlorine gas.

3. The method of claim 1, wherein the second gas comprises chlorine atoms.

4. The method of claim 1, further comprising:
   forming a dielectric layer on the substrate;
   forming the trench in the dielectric layer and the substrate;
   forming a gate dielectric layer in the trench;
   forming the barrier layer on the gate dielectric layer, a top surface of the dielectric layer and a sidewall of the dielectric layer.

5. The method of claim 4, further comprising performing the first etching process to remove part of the conductive layer so that a top surface of the conductive layer is lower than a bottom surface of the dielectric layer.

6. The method of claim 4, further comprising performing the second etching process to remove the barrier layer on the top surface of the dielectric layer and the sidewall of the dielectric layer.

7. The method of claim 4, wherein the dielectric layer comprises silicon oxide.

8. The method of claim 1, wherein the barrier layer comprises TiN.

9. The method of claim 1, wherein the conductive layer comprises W.

10. A method for fabricating semiconductor device, comprising:

providing a substrate having a memory region defined thereon;
forming a trench in the substrate;
forming a barrier layer in the trench;
forming a conductive layer on the barrier layer;
performing a first etching process to remove part of the conductive layer; and
performing a second etching process to remove part of the barrier layer, wherein the second etching process comprises a non-plasma etching process and the second etching process further comprises a soft etching process.

11. The method of claim 10, wherein a gas of the soft etching process is selected from the group consisting of $Cl_2$ and He.

12. A method for fabricating semiconductor device, comprising:
providing a substrate having a memory region defined thereon;
forming a trench in the substrate;
forming a barrier layer in the trench;
forming a conductive layer on the barrier layer;
performing a first etching process to remove part of the conductive layer without removing the barrier layer; and
performing a second etching process to remove part of the barrier layer, wherein the first etching process and the second etching process are different and the second etching process comprises a vapor etching process and a pressure of the vapor etching process is less than 100 mTorr.

13. The method of claim 12, wherein a gas of the vapor etching process is selected from the group consisting of $NH_3$, $H_2O_2$, HCl, $H_2O$, and $H_2SO_4$.

14. The method of claim 12, wherein a temperature of the vapor etching process is between 25° C. to 60° C.

* * * * *